United States Patent
Lee et al.

(10) Patent No.: US 12,262,527 B2
(45) Date of Patent: Mar. 25, 2025

(54) VERTICAL-CHANNEL CELL ARRAY TRANSISTOR STRUCTURE AND DRAM DEVICE INCLUDING THE SAME

(71) Applicant: Samsung Electronics Co., Ltd., Suwon-si (KR)

(72) Inventors: Changseok Lee, Gwacheon-si (KR); Sangwon Kim, Seoul (KR); Changhyun Kim, Seoul (KR); Kyung-Eun Byun, Seongnam-si (KR); Eunkyu Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 451 days.

(21) Appl. No.: 17/668,004

(22) Filed: Feb. 9, 2022

(65) Prior Publication Data
US 2023/0072229 A1    Mar. 9, 2023

(30) Foreign Application Priority Data
Sep. 8, 2021 (KR) .......... 10-2021-0119860

(51) Int. Cl.
*H10B 12/00* (2023.01)
*H01L 29/16* (2006.01)
(Continued)

(52) U.S. Cl.
CPC ....... *H10B 12/315* (2023.02); *H01L 29/1606* (2013.01); *H01L 29/2003* (2013.01);
(Continued)

(58) Field of Classification Search
CPC .... H10B 12/315; H10B 12/488; H10B 12/02; H10B 12/033; H10B 12/30;
(Continued)

(56) References Cited

U.S. PATENT DOCUMENTS 7,968,674 B2   6/2011   Choi et al.
7,988,941 B2   8/2011   Choi et al.
(Continued)

FOREIGN PATENT DOCUMENTS

WO    WO-2015/126139 A1   8/2015
WO    WO-2018/009931 A1   1/2018

OTHER PUBLICATIONS

Extended European Search Report dated Sep. 19, 2022 issued in related European patent application No. 22163047.8.
(Continued)

*Primary Examiner* — Joseph C. Nicely
*Assistant Examiner* — Alvin L Lee
(74) *Attorney, Agent, or Firm* — Harness, Dickey & Pierce, P.L.C.

(57) ABSTRACT

Provided are a vertical-channel cell array transistor structure and a dynamic random-access memory (DRAM) device including the same. The vertical-channel cell array transistor structure includes a semiconductor substrate, a plurality of channels arranged in an array on the semiconductor substrate and each extending perpendicularly from the semiconductor substrate, a gate insulating layer on the plurality of channels, a plurality of word lines on the semiconductor substrate and extending in a first direction, and a two-dimensional (2D) material layer on at least one surface of each of the plurality of word lines.

27 Claims, 12 Drawing Sheets

(51) Int. Cl.
  *H01L 29/20* (2006.01)
  *H01L 29/24* (2006.01)
  *H01L 29/76* (2006.01)
  *H01L 29/786* (2006.01)

(52) U.S. Cl.
  CPC .......... *H01L 29/24* (2013.01); *H01L 29/7606* (2013.01); *H01L 29/78642* (2013.01); *H10B 12/488* (2023.02); *H10B 12/02* (2023.02); *H10B 12/033* (2023.02); *H10B 12/30* (2023.02)

(58) Field of Classification Search
  CPC . H01L 29/1606; H01L 29/2003; H01L 29/24; H01L 29/7606; H01L 29/78642
  See application file for complete search history.

(56) References Cited

U.S. PATENT DOCUMENTS

| | | | |
|---|---|---|---|
| 8,133,466 B2 | 3/2012 | Shin et al. | |
| 8,283,038 B2 | 10/2012 | Choi et al. | |
| 8,535,553 B2 | 9/2013 | Kong et al. | |
| 8,623,761 B2 | 1/2014 | Bonilla et al. | |
| 8,723,024 B2 | 5/2014 | Choi et al. | |
| 8,895,433 B2 | 11/2014 | Bonilla et al. | |
| 8,906,787 B2 | 12/2014 | Park et al. | |
| 8,912,530 B2 | 12/2014 | Yang et al. | |
| 9,040,957 B2 | 5/2015 | Lee et al. | |
| 9,056,424 B2 | 6/2015 | Wenxu et al. | |
| 9,064,777 B2 | 6/2015 | Heo et al. | |
| 9,108,848 B2 | 8/2015 | Woo et al. | |
| 9,324,634 B2 | 4/2016 | Bao et al. | |
| 9,324,635 B2 | 4/2016 | Bao et al. | |
| 9,359,211 B2 | 6/2016 | Woo et al. | |
| 9,472,450 B2 | 10/2016 | Bonilla et al. | |
| 9,527,043 B2 | 12/2016 | Choi et al. | |
| 9,533,265 B2 | 1/2017 | Choi et al. | |
| 9,583,358 B2 | 2/2017 | Kim et al. | |
| 9,721,734 B2 | 8/2017 | Ryu et al. | |
| 10,325,987 B2 | 6/2019 | Park et al. | |
| 10,644,168 B2 | 5/2020 | Colinge et al. | |
| 10,892,325 B2 | 1/2021 | Li et al. | |
| 10,971,451 B2 | 4/2021 | Byun et al. | |
| 11,011,647 B2 | 5/2021 | Sandhu | |
| 2009/0114981 A1 | 5/2009 | Sung et al. | |
| 2009/0218616 A1 | 9/2009 | Jang et al. | |
| 2011/0127471 A1 | 6/2011 | Shin et al. | |
| 2013/0059155 A1 | 3/2013 | Choi et al. | |
| 2014/0087191 A1 | 3/2014 | Chua et al. | |
| 2015/0235959 A1 | 8/2015 | Lee et al. | |
| 2015/0303299 A1* | 10/2015 | Chang | H01L 21/02568 257/29 |
| 2016/0035676 A1 | 2/2016 | Im et al. | |
| 2017/0025508 A1 | 1/2017 | Lee et al. | |
| 2017/0033003 A1 | 2/2017 | Song et al. | |
| 2018/0069117 A1* | 3/2018 | Cho | H10B 12/053 |
| 2020/0035611 A1* | 1/2020 | Byun | H01L 21/76846 |
| 2020/0194376 A1* | 6/2020 | Naylor | H01L 29/45 |
| 2021/0125930 A1 | 4/2021 | Shin et al. | |

OTHER PUBLICATIONS

Chang-Seok Lee et al., 'Fabrication of Metal/Graphene Hybrid Interconnects by Direct Graphene Growth and Their Integration Properties' *Advanced Electronic Materials*, vol. 4, 2018, 1700624.

Kyung Kyu Min et al., 'Vertical Inner Gate Transistors for $4F^2$ DRAM Cell' *IEEE Transactions on Electron Devices*, vol. 67, No. 3, Mar. 2020.

* cited by examiner

VERTICAL-CHANNEL CELL ARRAY TRANSISTOR STRUCTURE AND DRAM DEVICE INCLUDING THE SAME

CROSS-REFERENCE TO RELATED APPLICATION

This application is based on and claims priority under 35 U.S.C. § 119 to Korean Patent Application No. 10-2021-0119860, filed on Sep. 8, 2021, in the Korean Intellectual Property Office, the disclosure of which is incorporated by reference herein in its entirety.

BACKGROUND

1. Field

The present disclosure relates to a vertical-channel cell array transistor structure and/or a dynamic random-access memory (DRAM) device including the same.

2. Description of the Related Art

Each unit device in a dynamic random-access memory (DRAM) device may have a 1T1C structure including one transistor and one capacitor. As the degree of device integration has continuously increased, a structure for reducing the area of each unit device in a plan view has been proposed. A recess-channel cell array transistor (RCAT) structure was initially applied to a DRAM device, but now a buried-channel cell array transistor (BCAT) is commercially available. A vertical-channel cell array transistor (VCAT) structure in which transistors are vertically arranged has been recently developed to further reduce the area of a unit device.

SUMMARY

Provided are vertical-channel cell array transistor structures and/or dynamic random-access memory (DRAM) devices including the same.

Additional aspects will be set forth in part in the description which follows and, in part, will be apparent from the description, or may be learned by practice of the presented embodiments of the disclosure.

According to an embodiment, a vertical-channel cell array transistor structure may include a semiconductor substrate, a plurality of channels arranged in an array on the semiconductor substrate and each extending perpendicularly from the semiconductor substrate, a gate insulating layer on the plurality of channels, a plurality of word lines on the semiconductor substrate and extending in a first direction, and a two-dimensional (2D) material layer on at least one surface of each of the plurality of word lines.

In some embodiments, each of the plurality of word lines may correspond to the plurality of channels arranged in the first direction.

In some embodiments, the 2D material layer may be on a bottom surface of the plurality of word lines. The 2D material layer may extend to a side surface of the plurality of word lines.

In some embodiments, the 2D material layer may be on a top surface of the plurality of word lines. The 2D material layer may be further provided on a bottom surface of the plurality of word lines.

In some embodiments, the 2D material layer may include at least one of a conductor, an insulator, and a semiconductor.

In some embodiments, the 2D material layer may include at least one of graphene, transition metal dichalcogenide (TMD), GaSe, GaTe$_2$, SnSe, Bi$_2$Se$_3$, Bi$_2$O$_2$Se, hexagonal boron nitride (h-BN), amorphous boron nitride (a-BN), silicene, stanene, tellurene, borophene, and antimonene.

In some embodiments, the graphene may include crystal grains having a size ranging from 1 nm to 100 nm.

In some embodiments, the TMD may include at least one of MoS$_2$, MoSe$_2$, MoTe$_2$, WS$_2$, WSe$_2$, WTe$_2$, ZrS$_2$, ZrSe$_2$, HfS$_2$, HfSe$_2$, NbSe$_2$, ReSe$_2$, PtS$_2$, PtSe$_2$, PdSe$_2$, PdTe$_2$, VS$_2$, Vse$_2$, FeSe$_2$, and FeTe$_2$.

In some embodiments, the plurality of word lines may include at least one of a metal, a semiconductor, and an alloy.

In some embodiments, the plurality of word lines each may have a single-layer structure, or a multi-layer structure in which different materials are stacked.

In some embodiments, the semiconductor substrate may include a plurality of source regions and the plurality of channels may include a plurality of drain regions such that each one of the plurality of channels may include one of the plurality of drain regions. The plurality of source regions and the plurality of drain regions respectively may be provided on a lower portion and an upper portion of each corresponding channel among the plurality of channels.

In some embodiments, the vertical-channel cell array transistor structure may further include a plurality of bit lines connecting the plurality of source regions in a second direction that intersects the first direction.

In some embodiments, the vertical-channel cell array transistor structure may further include a plurality of insulating materials between the plurality of bit lines and the plurality of insulating materials may extend in the second direction.

According to an embodiment, a dynamic random-access memory (DRAM) device includes a vertical-channel cell array transistor structure and a plurality of capacitors on the vertical-channel cell array transistor structure. The vertical-channel cell array transistor structure may include a semiconductor substrate, a plurality of channels arranged in an array on the semiconductor substrate and each extending perpendicularly from the semiconductor substrate, a gate insulating layer on the plurality of channels, a plurality of word lines on the semiconductor substrate and extending in a first direction, and a two-dimensional (2D) material layer on at least one surface of each of the plurality of word lines.

In some embodiments, the 2D material layer may be on at least one of a bottom surface of the plurality of word lines and a top surface of the plurality of word lines. The 2D material layer may further extend to a side surface of the plurality of word lines.

In some embodiments, the semiconductor substrate may include a plurality of source regions and the plurality of channels may include a plurality of drain regions such that each one of the plurality of channels may include one of the plurality of drain regions. The plurality of source regions and the plurality of drain regions respectively may be provided on a lower portion and an upper portion of each corresponding channel among the plurality of channels.

In some embodiments, the vertical-channel cell array transistor structure may further include a plurality of bit lines connecting the plurality of source regions in a second direction that intersects the first direction.

In some embodiments, each of the plurality of capacitors may be electrically connected to a corresponding one of the plurality of drain regions.

According to another embodiment, an electronic device includes the DRAM device.

According to an embodiment, a vertical-channel cell array transistor structure may include a semiconductor substrate including a source region; a channel structure on the source region, the channel structure including a channel extending vertical to an upper surface of the semiconductor substrate and a drain region over the channel; a word line on the semiconductor substrate, the word line extending in a first direction; a gate insulating layer between the word line and the channel structure, the gate insulating layer surrounding the channel structure; and a two-dimensional material layer directly contacting the word line.

In some embodiments, the 2D material layer may include at least one of graphene, transition metal dichalcogenide (TMD), GaSe, GaTe$_2$, SnSe, Bi$_2$Se$_3$, Bi$_2$O$_2$Se, hexagonal boron nitride (h-BN), amorphous boron nitride (a-BN), silicene, stanene, tellurene, borophene, and antimonene.

In some embodiments, the 2D material layer may directly contact a bottom surface of the word line.

In some embodiments, the 2D material layer may directly contact a top surface of the word line.

In some embodiments, the 2D material layer may extend between the word line and the gate insulating layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
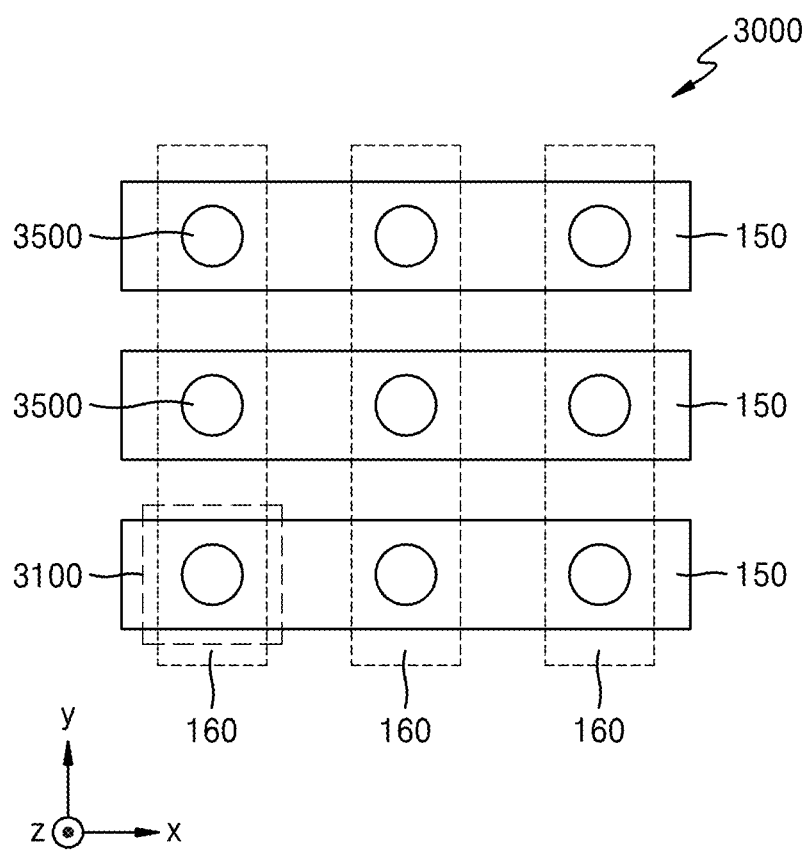
FIG. 1 is a plan view illustrating a dynamic random-access memory (DRAM) device according to an embodiment.

Reference will now be made in detail to embodiments, examples of which are illustrated in the accompanying drawings, wherein like reference numerals refer to like elements throughout. In this regard, embodiments of inventive concepts may have different forms and should not be construed as being limited to the descriptions set forth herein. Accordingly, the presented embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

Hereinafter, embodiments of the present disclosure will be described with reference to the drawings. Like reference numerals denote like elements throughout, and in the drawings, sizes of elements may be exaggerated for clarity and convenience of explanation. Also, the embodiments described below are merely examples, and various modifications may be made from the embodiments.

When a first element is "on ~" or "over" a second element, it may include a case where the first element contacts the second element and is directly located on the top, bottom, left, or right of the second element, and a case where the first element does not contact the second element and is located on the top, bottom, left, or right of the second element with a third element therebetween. The singular forms "a," "an," and "the" are intended to include the plural forms as well, unless the context clearly indicates otherwise. When a portion "includes" an element, another element may be further included, rather than excluding the existence of the other element, unless otherwise described.

The use of the terms "a" and "an," and "the" and similar referents in the context of describing the present disclosure is to be construed to cover both the singular and the plural. The steps of all methods described herein may be performed in any suitable order unless otherwise indicated herein or otherwise clearly contradicted by context, and are not limited to the described order.

Also, the terms such as "unit" or "module" refer to units that perform at least one function or operation, and the units may be implemented as hardware or software or as a combination of hardware and software.

Also, lines or members connecting elements illustrated in the drawings are merely illustrative of functional connections and/or physical or circuit connections. In an actual device, the connections between components may be represented by various functional connections, physical connections, or circuit connections that are replaceable or added.

The use of any and all examples, or example language provided herein, is intended merely to better describe the present disclosure and does not pose a limitation on the scope of the present disclosure unless otherwise claimed.

Figure 2:
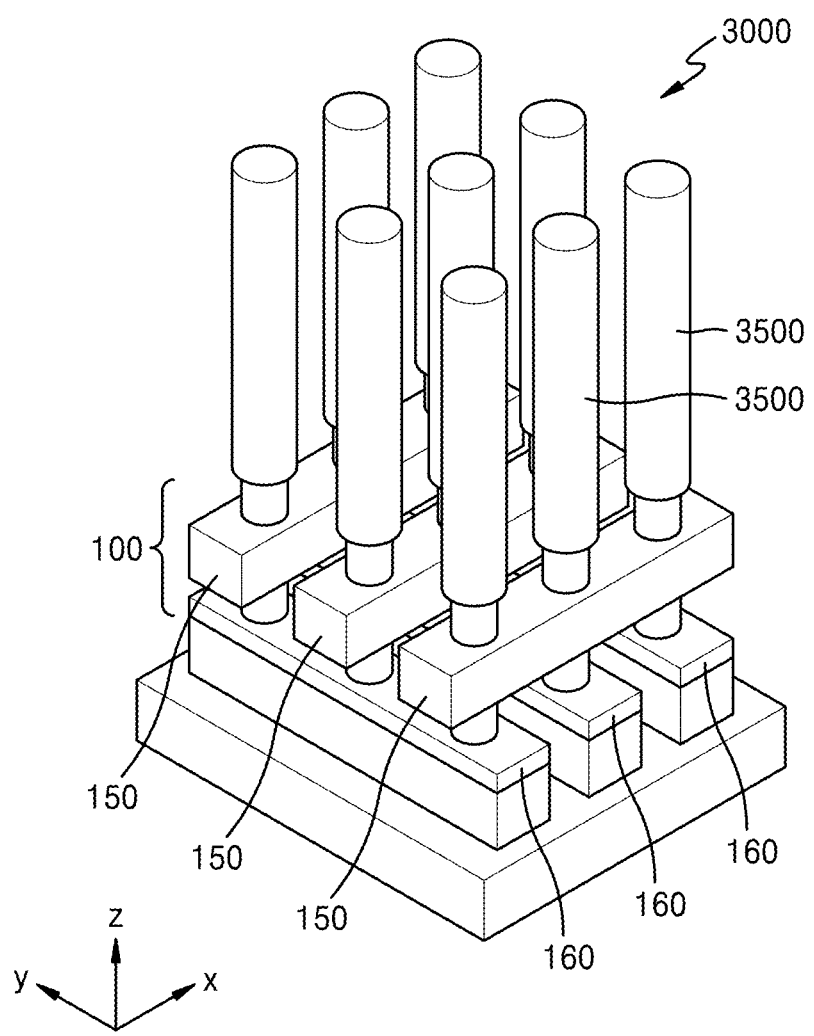
FIG. 2 is a perspective view illustrating the DRAM device of FIG. 1.

FIG. 1 is a plan view illustrating a dynamic random-access memory (DRAM) device 3000 according to an embodiment. FIG. 2 is a perspective view illustrating the DRAM device 3000 of FIG. 1.

Referring to FIGS. 1 and 2, the DRAM device 3000 includes a plurality of unit devices 3100 arranged in an array. Each unit device 3100 has a 1T1C structure including one transistor and one capacitor.

The DRAM device 3000 includes a vertical-channel cell array transistor (VCAT) structure 100 and a plurality of capacitors 3500 provided on the VCAT structure 100. In the VCAT structure 100, a plurality of word lines 150 and a plurality of bit lines 160 are provided to cross each other. Each word line 150 may extend in a first direction (e.g., an x-axis direction), and each bit line 160 may extend in a second direction (e.g., a y-axis direction) that intersects the first direction. Transistors may be located at intersections between the plurality of word lines 150 and the plurality of bit lines 160.

Figure 3:
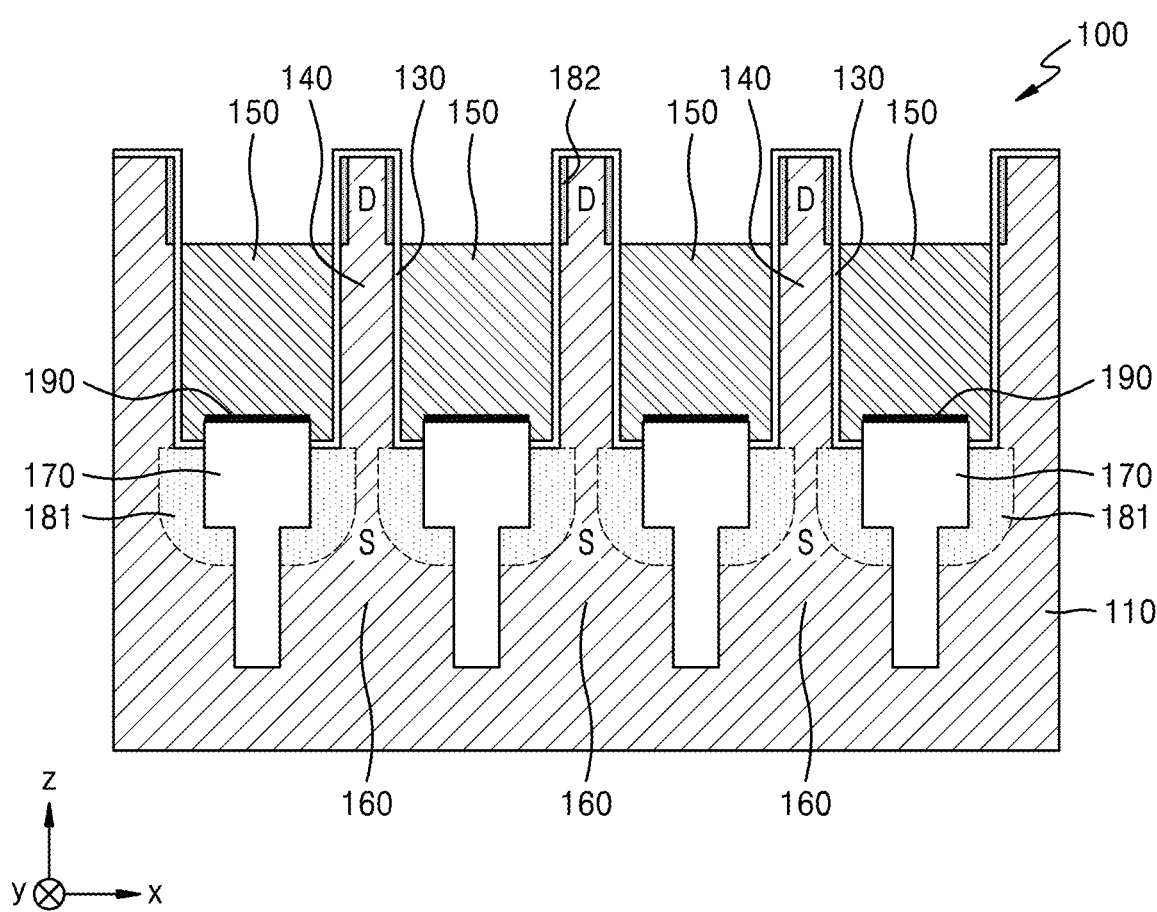
FIG. 3 is a cross-sectional view illustrating a vertical-channel cell array transistor (VCAT) structure of FIG. 1.

FIG. 3 is a cross-sectional view illustrating the VCAT structure 100 of FIG. 1.

Referring to FIG. 3, the VCAT structure 100 includes a semiconductor substrate 110 and a plurality of channels 140 arranged in an array on the semiconductor substrate 110. The plurality of channels 140 may be arranged in a two-dimensional (2D) array on a plane (e.g., an xy plane) of the semiconductor substrate 110.

The semiconductor substrate 110 may include, for example, silicon (Si). As a specific example, the semiconductor substrate 110 may be a silicon substrate doped with n-type impurities. However, this is merely an example, and the semiconductor substrate 110 may include, for example, a group IV semiconductor material such as germanium (Ge), silicon germanium (SiGe), or silicon carbide (SiC), a group III-V semiconductor material such as gallium arsenide (GaAs), indium arsenide (InAs), or indium phosphide (InP), an oxide semiconductor, a nitride semiconductor, or an oxynitride semiconductor. However, the present disclosure is not limited thereto.

Each of the plurality of channels 140 may extend perpendicularly from the semiconductor substrate 110. Each channel 140 may perpendicularly protrude from a top surface of the semiconductor substrate 110. Each channel 140 may be integrally formed with the semiconductor substrate 110 and may include the same semiconductor material as that of the semiconductor substrate 110.

A source S and a drain D are respectively provided on lower and upper portions of each channel 140. The source S is electrically connected to the lower portion of the channel 140, and the drain D is electrically connected to the upper portion of the channel 140. First and second doped regions 181 and 182 which are heavily doped regions are formed in the source S and the drain D. The capacitor 3500 of FIG. 2 may be connected to the drain D provided on the upper portion of the channel 140.

The sources S are provided in an array around the top surface of the semiconductor substrate 110 to correspond to the channels 140. A plurality of bit lines 160 are provided under the sources S to extend in the second direction (e.g., the Y-axis direction). Each bit line 160 may electrically connect the sources S arranged in the second direction. The plurality of bit lines 160 may be formed in the semiconductor substrate 110 and may include the same semiconductor material as that of the semiconductor substrate 110.

A plurality of insulating materials 170 may be provided in the semiconductor substrate 110 between the plurality of bit lines 160. The plurality of insulating materials may extend in the second direction parallel to the plurality of bit lines 160, to separate the plurality of bit lines 160 inside the semiconductor substrate 110. The insulating materials 170 may include, for example, silicon oxide, silicon nitride, aluminum oxide, hafnium oxide, or zirconium oxide, but this is merely an example and may include various other materials.

A gate insulating layer 130 is formed on surfaces of the channels 140. The gate insulating layer 130 may include, for example, but is not limited to, silicon oxide, silicon nitride, aluminum oxide, hafnium oxide, or zirconium oxide.

A plurality of word lines 150 are provided on the semiconductor substrate 110 to extend in the first direction (e.g., the x-axis direction). The first direction may be a direction intersecting the second direction. For example, the first direction may be a direction perpendicular to the second direction. However, the present disclosure is not limited thereto.

Each word line 150 may be provided to correspond to the channels 140 arranged in the first direction. In detail, each word line 150 may surround the channels 140 arranged in the first direction. The word line 150 may function as a gate electrode.

The plurality of word lines 150 may be provided to cross the plurality insulating materials 170 provided under the plurality of word lines 150. Top surfaces of the insulating materials 170 may be adjacent to bottom surfaces of the word lines 150. Upper portions of the insulating materials 170 may protrude from the bottom of the word lines 150. However, the present disclosure is not limited thereto.

The word line 150 may include a conductive material. For example, the word line 150 may include at least one of a metal, a semiconductor, and an alloy. Examples of the metal may include aluminum (Al), tungsten (W), molybdenum (Mo), titanium (Ti), and tantalum (Ta). Examples of the semiconductor may include a group IV semiconductor material, a group III-V semiconductor material, an oxide semiconductor, a nitride semiconductor, and an oxynitride semiconductor. The present disclosure is not limited thereto.

A two-dimensional (2D) material layer 190 is provided on the bottom surface of the word line 150. In detail, the 2D material layer 190 is provided on the bottom surface of the word line 150 contacting the top surface of the insulating material 170.

The 2D material layer 190 includes a 2D material having a 2D crystal structure. The 2D material may have a single or multi-layer structure, and each of layers constituting the 2D material may have an atomic-level thickness.

The 2D material layer 190 may include a conductor, an insulator, or a semiconductor. The 2D material layer 190 may include graphene. Graphene refers to a material including carbon atoms arranged in a 2D hexagonal honeycomb structure. Graphene may include crystal grains having a size ranging from about 1 nm to about 100 nm. However, the present disclosure is not limited thereto, and graphene may include crystal grains having a size greater than 100 nm.

The 2D material layer 190 may include transition metal dichalcogenide (TMD). The TMD is a 2D material having semiconductor properties and is a compound of a transition metal and a chalcogen element. Examples of the transition metal may include, but are not limited to, molybdenum (Mo), tungsten (W), niobium (Nb), vanadium (V), tantalum (Ta), titanium (Ti), zirconium (Zr), hafnium (Hf), cobalt (Co), technetium (Tc), and rhenium (Re). Also, examples of the chalcogen element may include, but are not limited to, sulfur(S), selenium (Se), and tellurium (Te). Specifically, the TMD may include at least one selected from the group consisting of $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, $PtS_2$, $PtSe_2$, $PdSe_2$, $PdTe_2$, $VS_2$, $Vse_2$, $FeSe_2$, and $FeTe_2$.

The 2D material layer 190 may include hexagonal boron nitride (h-BN) or amorphous boron nitride (a-BN). The 2D material layer may include any of various other 2D materials such as GaSe, $GaTe_2$, SnSe, $Bi_2Se_3$, $Bi_2O_2Se$, silicene, stanene, tellurene, borophene, or antimonene.

In the present embodiment, the 2D material layer 190 provided on the bottom surface of the word line 150 may be used as a liner for guiding grain growth when the word line 150 functioning as a gate electrode is formed. Accordingly, the word line 150 grown by using the 2D material layer 190 may include crystal grains having a large size to form a low-resistance wiring. Due to low resistance characteristics of the word line 150, resistive-capacitive (RC) delay may also be reduced.

Figure 4:
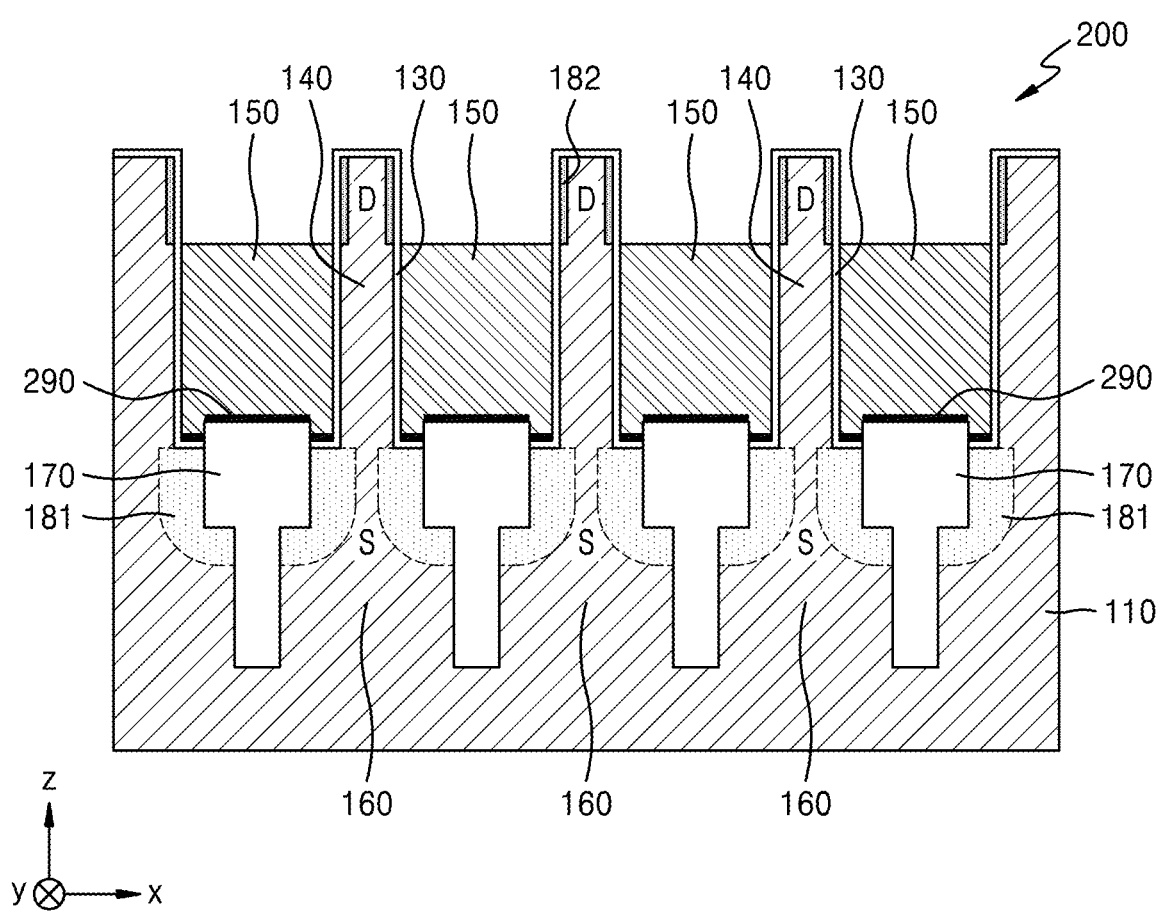
FIG. 4 is a view illustrating a VCAT structure according to another embodiment.

FIG. 4 illustrates a VCAT structure 200 according to another embodiment. The following will focus on a difference from the above embodiment.

Referring to FIG. 4, a 2D material layer 290 is provided on a bottom surface of the word line 150. In detail, the 2D material layer 290 is provided on a bottom surface of the word line 150 contacting a top surface of the insulating material 170 and on bottom surfaces of the word line 150 located on both sides of the protruding insulating material 170.

Figure 5:
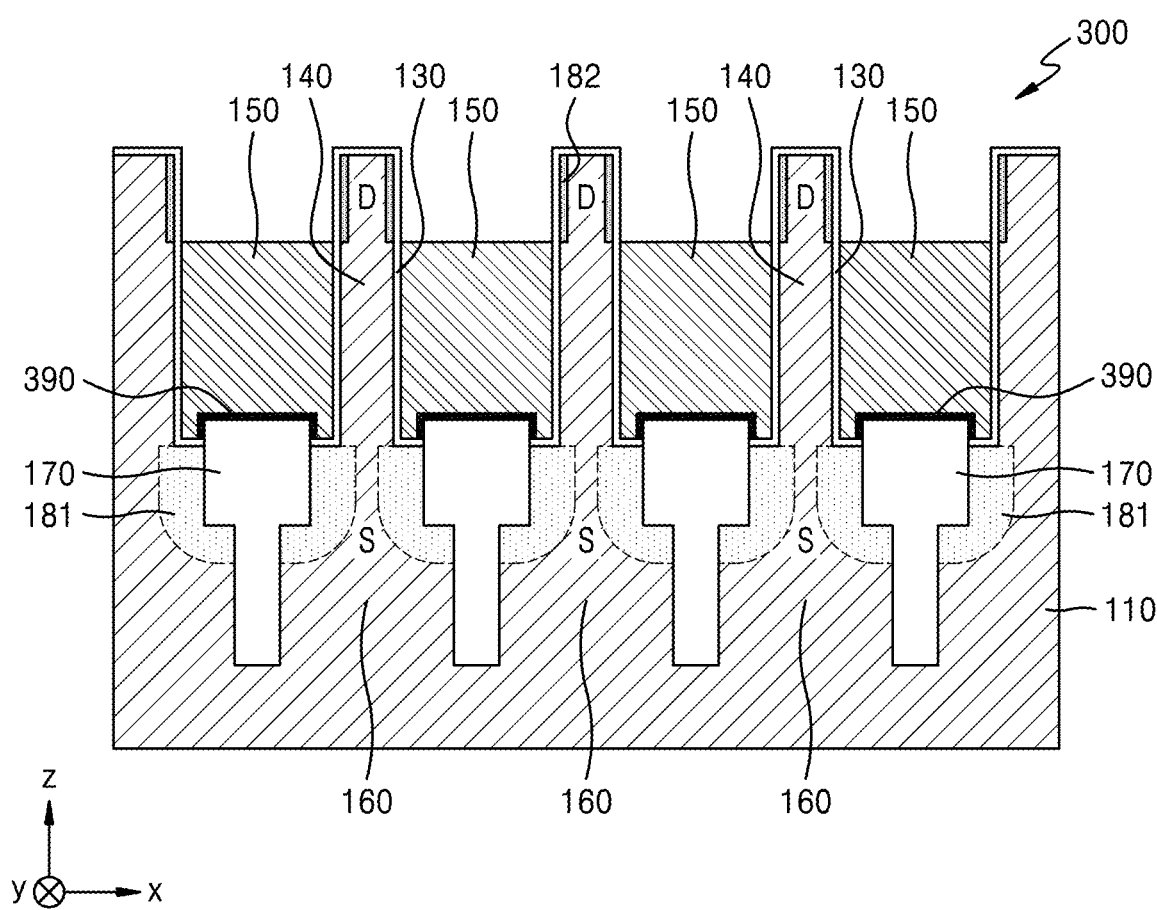
FIG. 5 is a view illustrating a VCAT structure according to another embodiment.

FIG. 5 illustrates a VCAT structure 300 according to another embodiment.

Referring to FIG. 5, a 2D material layer 390 is provided on a bottom surface of the word line 150. In detail, the 2D material layer 390 is provided on a bottom surface of the word line 150 contacting a top surface of the insulating material 170 and on a bottom surface of the word line 150 contacting a protruding side surface of the insulating material 170.

Figure 6:
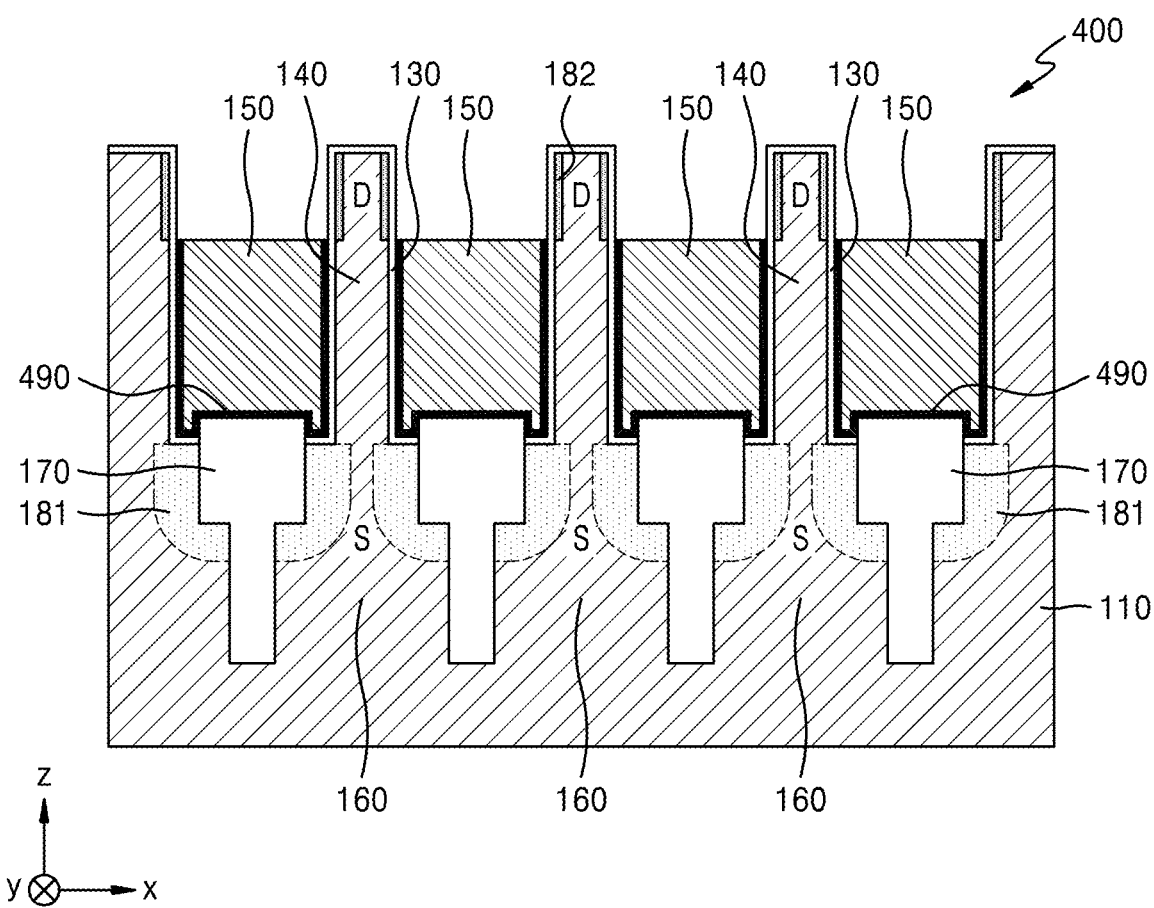
FIG. 6 is a view illustrating a VCAT structure according to another embodiment.

FIG. 6 illustrates a VCAT structure 400 according to another embodiment.

Referring to FIG. 6, a 2D material layer 490 is provided on a bottom surface and a side surface of the word line 150. In detail, the 2D material layer 490 extends from the bottom surface of the word line 150 to the side surface.

Figure 7:
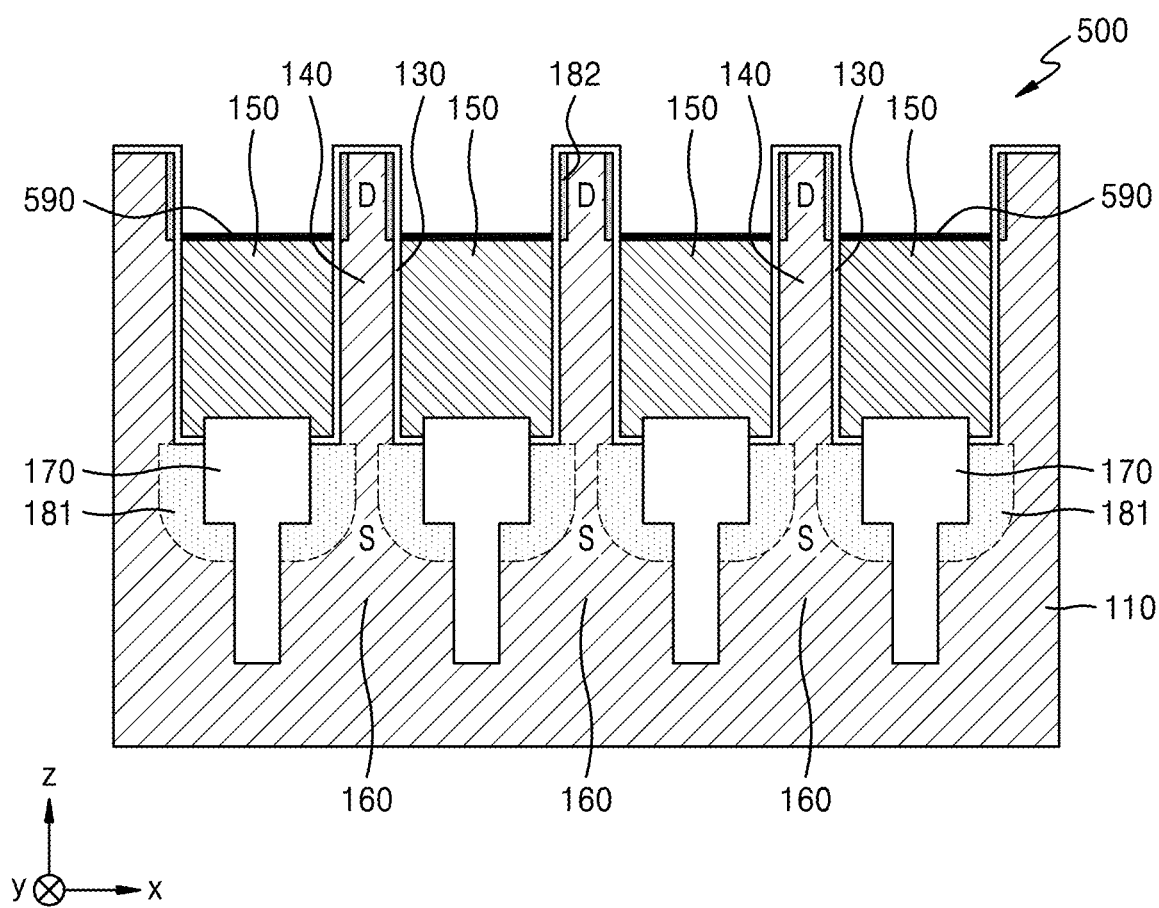
FIG. 7 is a view illustrating a VCAT structure according to another embodiment.

FIG. 7 illustrates a VCAT structure 500 according to another embodiment.

Referring to FIG. 7, the VCAT structure 500 includes the semiconductor substrate 110 and the plurality of channels 140 arranged in an array on the semiconductor substrate 110. Each of the plurality of channels 140 may extend perpendicularly perpendicular from semiconductor substrate 110.

The source S and the drain D are respectively provided on a lower portion and an upper portion of each channel 140. The gate insulating layer 130 is formed on surfaces of the channels 140. The plurality of word lines 150 are provided on the semiconductor substrate 110 to extend in the first direction (e.g., the x-axis direction). The word lines 150 are provided to respectively correspond to the channels 140 arranged in the first direction.

The sources S are provided in an array around a top surface of the semiconductor substrate 110 to correspond to the channels 140, and the plurality of bit lines 160 are provided under the sources S to extend in the second direction (e.g., the y-axis direction). Each bit line 160 may electrically connect the sources S arranged in the second direction.

The plurality of insulating materials 170 may be provided in the semiconductor substrate 110 between the plurality of bit lines 160. The plurality of word lines 150 may be located over the plurality of insulating materials 170. Upper portions of the insulating materials 170 may protrude from the bottom of the word lines 150. However, the present disclosure is not limited thereto.

A 2D material layer 590 is provided on a top surface of the word line 150. The 2D material layer 590 may include a conductor, an insulator, or a semiconductor. For example, the 2D material layer 590 may include at least one selected from the group consisting of graphene, TMD, h-BN, a-BN, GaSe, GaTe$_2$, SnSe, Bi$_2$Se$_3$, Bi$_2$O$_2$Se, silicene, stanene, tellurene, borophene, and antimonene. The TMD may include at least one selected from the group consisting of MoS$_2$, MoSe$_2$, MoTe$_2$, WS$_2$, WSe$_2$, WTe$_2$, ZrS$_2$, ZrSe$_2$, HfS$_2$, HfSe$_2$, NbSe$_2$, ReSe$_2$, PtS$_2$, PtSe$_2$, PdSe$_2$, PdTe$_2$, VS$_2$, Vse$_2$, FeSe$_2$, and FeTe$_2$.

In the present embodiment, the 2D material layer 590 provided on the top surface of the word line 150 may function as a barrier layer for protecting the top surface of the word line 150. In detail, the 2D material layer 590 provided on the top surface of the word line 150 may prevent damage to the top surface of the word line 150 in a process of forming the drain D through an angled ion implantation process, and may maintain low resistance characteristics through surface scattering reduction of the word line 150.

The 2D material layer 590 provided on the top surface of the word line 150 may reduce oxidation of a surface of the word line 150, and may reduce damage to the surface of the word line 150 in a subsequent process.

The 2D material layer 590 provided on the top surface of the word line 150 may adjust a work function by forming a graphene/metal structure, and thus may reduce gate induced drain leakage (GIDL).

Table 1 shows a work function of a metal and a work function of a graphene/metal structure.

TABLE 1

| Metal | Metal Work Function (eV) | Graphene/Metal Work Function (eV) |
|---|---|---|
| W | 4.80 | 3.91 |
| Mo | 4.61 | 3.87 |
| Ru | 5.03 | 3.90 |
| TiN | 3.03 | 4.04 |

Figure 8:
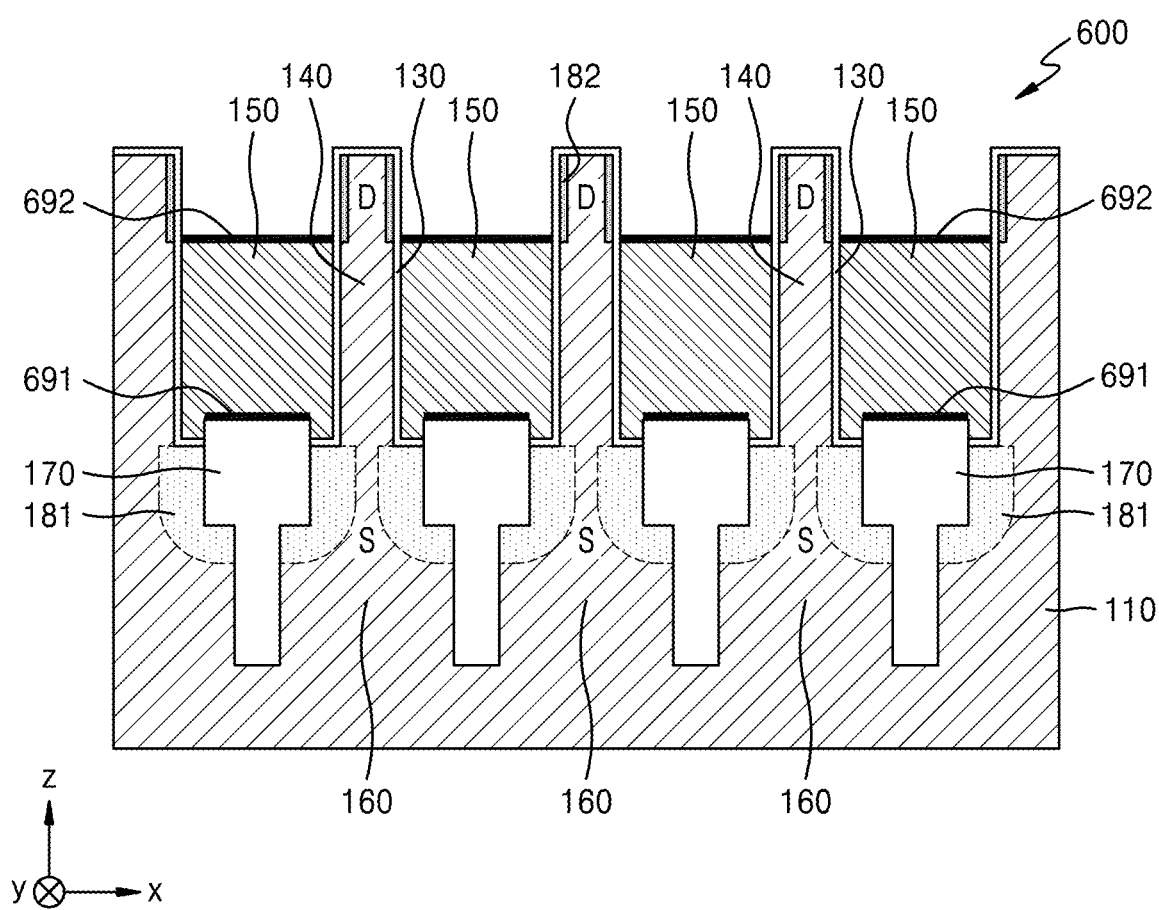
FIG. 8 is a view illustrating a VCAT structure according to another embodiment.

FIG. 8 illustrates a VCAT structure 600 according to another embodiment.

Referring to FIG. 8, the VCAT structure 600 includes the semiconductor substrate 110 and the plurality of channels 140 arranged in an array on the semiconductor substrate 110. Each of the plurality of channels 140 may extend perpendicularly from the semiconductor substrate 110.

The source S and the drain D are respectively provided on a lower portion and an upper portion of each channel 140. The gate insulating layer 130 is formed on surfaces of the channels 140. The plurality of word lines 150 are provided on the semiconductor substrate 110 to extend in the first direction (e.g., the x-axis direction). The word lines 150 are provided to respectively correspond to the channels 140 arranged in the first direction.

The sources S are provided in an array around a top surface of the semiconductor substrate 110 to correspond to the channels 140, and the plurality of bit lines 160 are provided under the sources S to extend in the second direction (e.g., the y-axis direction). Each bit line 160 may electrically connect the sources S arranged in the second direction.

The plurality of insulating materials 170 may be provided in the semiconductor substrate 110 between the plurality of bit lines 160. The plurality of word lines 150 may be located over the plurality of insulating materials 170. Upper portions of the insulating materials 170 may protrude from the bottom of the word lines 150. However, the present disclosure is not limited thereto.

A first 2D material layer 691 is provided on a bottom surface of the word line 150, and a second 2D material layer 692 is provided on a top surface of the word line 150.

In FIG. 8, the first 2D material layer 691 is provided on a bottom surface of the word line 150 contacting a top surface of the insulating material 170. However, the present embodiment is not limited thereto, and the first 2D material layer 691 may be provided on a bottom surface of the word line 150 contacting a top surface of the insulating material 170 and on bottom surfaces of the word line 150 located on both sides of the protruding insulating material 170, as shown in FIG. 4. The first 2D material layer 691 may be provided on a bottom surface of the word line 150 contacting a top surface of the insulating material 170 and on a bottom surface of the word line 150 contacting a protruding side surface of the insulating material 170, as shown in FIG. 5. The first 2D material layer 691 may extend from a bottom surface to a side surface of the word line 150, as shown in FIG. 6.

Each of the first and second 2D material layers 691 and 692 may include a conductor, an insulator, or a semiconductor. For example, each of the first and second 2D material layers 691 and 692 may include at least one selected from the group consisting of graphene, TMD, h-BN, a-BN, GaSe, $GaTe_2$, SnSe, $Bi_2Se_3$, $Bi_2O_2Se$, silicene, stanene, tellurene, borophene, and antimonene. The TMD may include at least one selected from the group consisting of $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, $PtS_2$, $PtSe_2$, $PdSe_2$, $PdTe_2$, $VS_2$, $Vse_2$, $FeSe_2$, and $FeTe_2$. The first and second 2D material layers 691 and 692 may include the same material. However, the present disclosure is not limited thereto, and the first and second 2D material layers 691 and 692 may include different materials.

As described above, the first 2D material layer 691 provided on the bottom surface of the word line 150 may grow the word line 150 including large crystal grains, to form a low-resistance wiring. Also, the second 2D material layer 692 provided on the top surface of the word line 150 may function as a barrier layer for protecting the top surface of the word line 150. The second 2D material layer 692 may adjust a work function of the word line 150 that is a gate, and thus may reduce GIDL.

Figure 9:
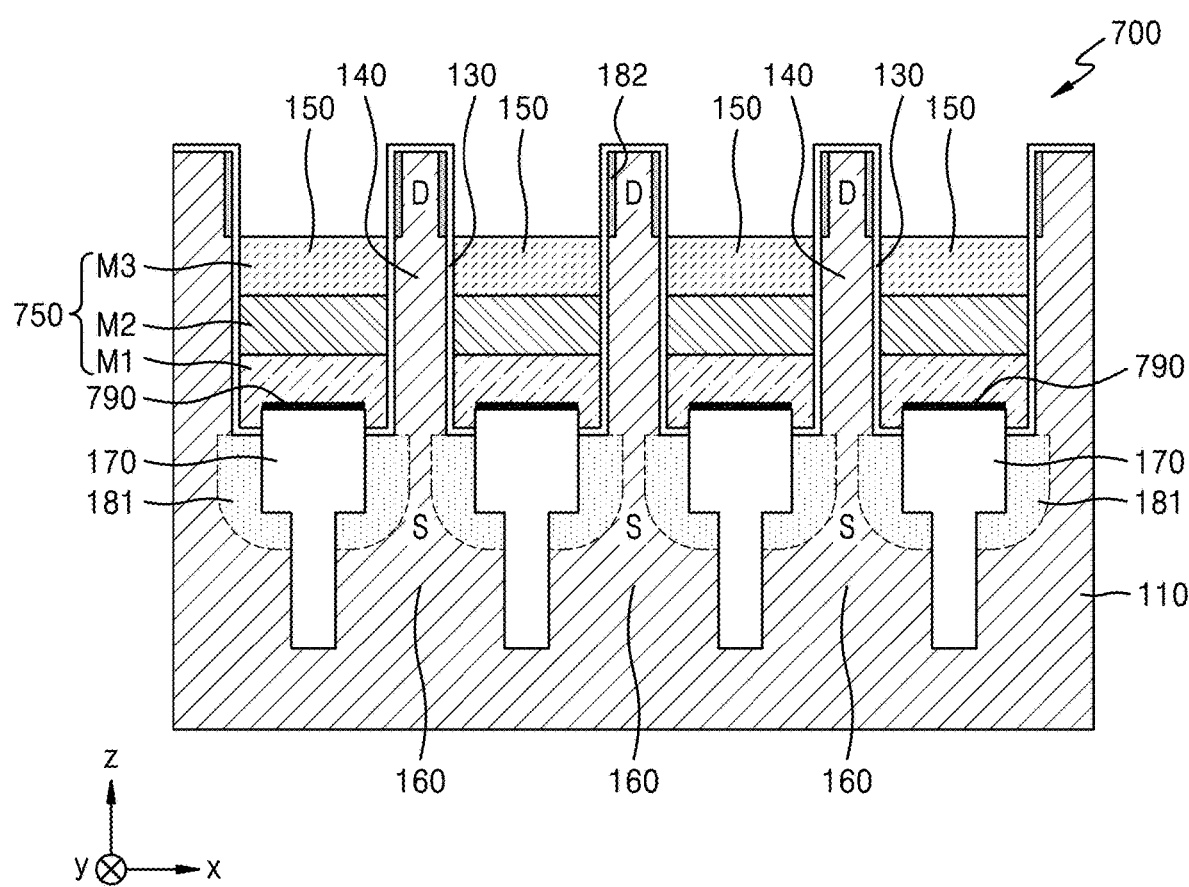
FIG. 9 is a view illustrating a VCAT structure according to another embodiment.

FIG. 9 illustrates a VCAT structure 700 according to another embodiment.

In the above embodiments, the word line 150 has a single-layer structure including one material. In the present embodiment, a word line 750 has a multi-layer structure in which different materials are stacked. In FIG. 9, three layers including different materials, that is, first, second, and third layers M1, M2, and M3, are sequentially stacked. Each of the first, second, and third layers M1, M2, and M3 may independently include at least one of a metal, a semiconductor, and an alloy. The number of layers constituting the word line 750 may be changed in various ways.

In FIG. 9, a 2D material layer 790 is provided only on a bottom surface of the word line 750. However, this is merely an example, and the 2D material layer 790 may extend from the bottom surface to a side surface of the word line 750. Also, the 2D material layer 790 may be provided on a top surface of the word line 750, or may be provided on the top surface and the bottom surface of the word line 750.

Figure 10:
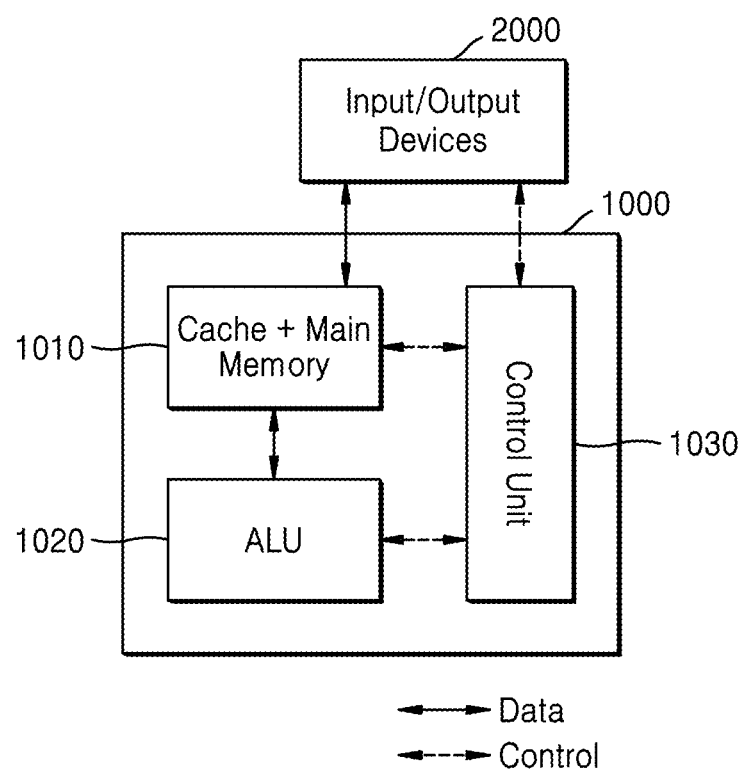
FIGS. 10 and 11 are conceptual diagrams illustrating a device architecture that may be applied to an electronic device according to an embodiment.
Figure 11:
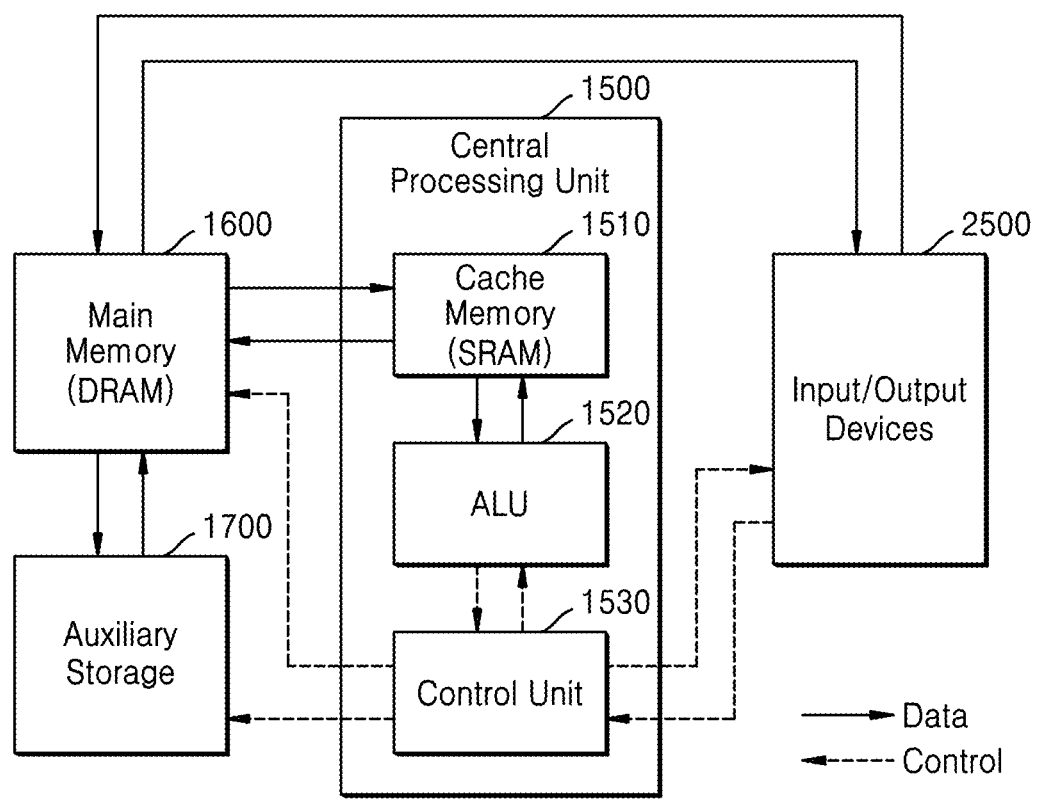

The above-described DRAM device may be used to temporarily store data in various electronic devices. FIGS. 10 and 11 are conceptual diagrams illustrating a device architecture that may be applied to an electronic device according to embodiments.

Referring to FIG. 10, a device architecture 1000 may include a memory unit 1010, an arithmetic logic unit (ALU) 1020, and a control unit 1030. The memory unit 1010, the ALU 1020, and the control unit 1030 may be electrically connected to one another. For example, the device architecture 1000 may be implemented as one chip including the memory unit 1010, the ALU 1020, and the control unit 1030.

In detail, the memory unit 1010, the ALU 1020, and the control unit 1030 may be interconnected through a metal line on a chip and may directly communicate with one another. The memory unit 1010, the ALU 1020, and the control unit 1030 may be monolithically integrated on one substrate to form one chip. An input/output device 2000 may be connected to the device architecture 1000. Also, the memory unit 1010 may include both a main memory and a cache memory. The main memory may include the above-described DRAM device. The device architecture 1000 may be an on-chip memory processing unit.

Referring to FIG. 11, a cache memory 1510, an ALU 1520, and a control unit 1530 may constitute a central processing unit (CPU) 1500, and the cache memory 1510 may include a static random-access memory (SRAM). Aside from the CPU 1500, a main memory 1600 and an auxiliary storage 1700 may be provided. The main memory 1600 may include the above-described DRAM device. When necessary, the device architecture may be implemented so that computing device devices and memory unit devices are adjacent to each other in one chip, without distinction between sub-units. An input/output device 2500 (e.g., keyboard) may be connected to the device central processing unit (CPU) 1500.

Figure 12:
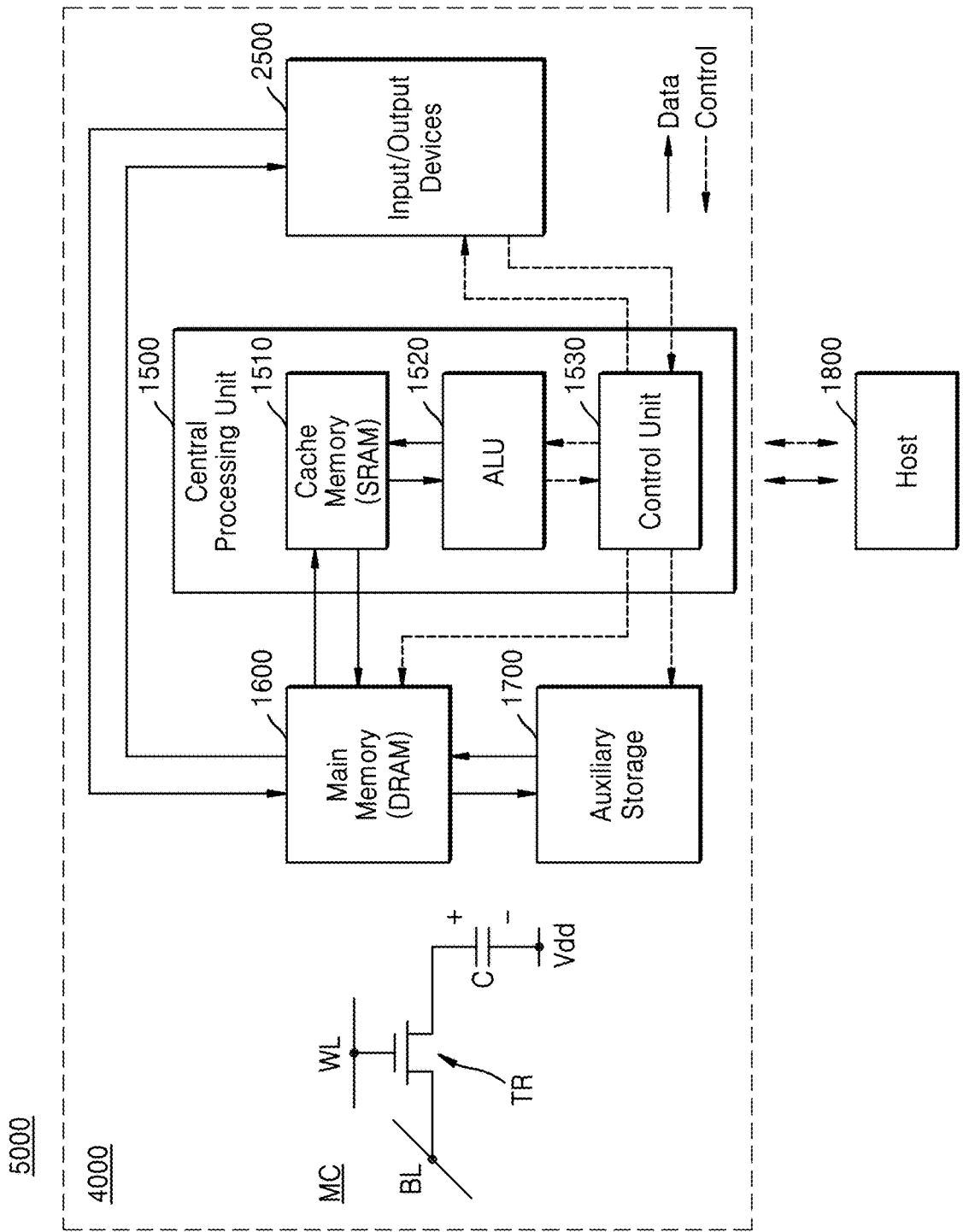
FIG. 12 is a schematic diagram of a memory system including according to an embodiment.

FIG. 12 is a schematic diagram of a memory system including according to an embodiment.

Referring to FIG. 12, a memory system 5000 may include an electronic device 4000, which may include a main memory 1600 for storing data and a central processing unit 1500. The central processing unit 1500 may read and write data from and into the main memory 1600 in response to read and write requests of a host 1800. The central processing unit 1500 may make an address mapping table for mapping an address provided from the host 1800 (e.g., a mobile device or a computer system) into a physical address of the main memory 1600. The central processing unit 1500 may be implemented with processing circuitry processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The main memory 1600 may include a plurality of memory cells MC.

Referring to FIGS. 2-9 and 12, each of the memory cells MC may include a capacitor C connected to a transistor TR, and may have structure including features of any one of the VCAT structures 100, 200, 300, 400, 500, 600, and 700 described above. The transistor TR in FIG. 12 may be provided at an intersection between one of the word lines 150 (WL) and one of the bit lines 160 (BL) in FIGS. 2 to 9 and 12 and the capacitor C in FIG. 12 may include the capacitor 3500 in FIG. 2 connected to the drain D of the channel 140 in FIGS. 2 to 9.

According to the embodiments, because a 2D material layer is provided on a bottom surface of a word line so that the word line has large crystal grains, a gate line may be formed as a low-resistance wiring and RC delay may be reduced due to low resistance characteristics.

Also, because the 2D material layer is provided on a top surface of the word line, the top surface of the word line may be protected. The 2D material layer may prevent damage to the top surface of the word line in a process of forming the drain D through an angled ion implantation process. Oxidation of a surface of the word line may be reduced, and damage to the surface of the word line may be reduced in a subsequent process. The 2D material layer provided on the top surface of the word line may reduce GIDL by adjusting a work function of the word line. While the embodiments have been described in the above, these are merely examples, and it will be understood by one of ordinary skill in the art that various modifications may be made therein without departing from the scope of the present disclosure.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A vertical-channel cell array transistor structure comprising:
   a semiconductor substrate;
   a plurality of channels arranged in an array on the semiconductor substrate, each of the plurality of channels extending perpendicularly from the semiconductor substrate;
   a gate insulating layer on the plurality of channels;
   a plurality of word lines on the semiconductor substrate and extending in a first direction; and
   a two-dimensional (2D) material layer directly contacting at least one surface of each of the plurality of word lines.

2. The vertical-channel cell array transistor structure of claim 1,
   wherein each of the plurality of word lines corresponds to one of the plurality of channels arranged in the first direction.

3. The vertical-channel cell array transistor structure of claim 1,
   wherein the 2D material layer is on a bottom surface of the plurality of word lines.

4. The vertical-channel cell array transistor structure of claim 3,
   wherein the 2D material layer extends to a side surface of the plurality of word lines.

5. The vertical-channel cell array transistor structure of claim 1,
   wherein the 2D material layer is on a top surface of the plurality of word lines.

6. The vertical-channel cell array transistor structure of claim 5,
   wherein the 2D material layer is on a bottom surface of the plurality of word lines.

7. The vertical-channel cell array transistor structure of claim 1,
   wherein the 2D material layer comprises at least one of a conductor, an insulator, and a semiconductor.

8. The vertical-channel cell array transistor structure of claim 7,
   wherein the 2D material layer comprises at least one of graphene, transition metal dichalcogenide (TMD), $GaSe$, $GaTe_2$, $SnSe$, $Bi_2Se_3$, $Bi_2O_2Se$, hexagonal boron nitride (h-BN), amorphous boron nitride (a-BN), silicene, stanene, tellurene, borophene, and antimonene.

9. The vertical-channel cell array transistor structure of claim 8,
   wherein the graphene comprises crystal grains having a size ranging from 1 nm to 100 nm.

10. The vertical-channel cell array transistor structure of claim 8,
    wherein the TMD comprises at least one of $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, $PtS_2$, $PtSe_2$, $PdSe_2$, $PdTe_2$, $VS_2$, $Vse_2$, $FeSe_2$, and $FeTe_2$.

11. The vertical-channel cell array transistor structure of claim 1,
    wherein the plurality of word lines comprise at least one of a metal, a semiconductor, and an alloy.

12. The vertical-channel cell array transistor structure of claim 1,
    wherein the plurality of word lines each have a single-layer structure or a multi-layer structure in which different materials are stacked.

13. The vertical-channel cell array transistor structure of claim 1, wherein
    the semiconductor substrate includes a plurality of source regions,
    the plurality of channels include a plurality of drain regions such that each one of the plurality of channels includes one of the plurality of drain regions,
    the plurality of source regions and the plurality of drain regions respectively provided on a lower portion and an upper portion of each corresponding channel among the plurality of channels.

14. The vertical-channel cell array transistor structure of claim 13, further comprising:
    a plurality of bit lines connecting the plurality of source regions in a second direction that intersects the first direction.

15. The vertical-channel cell array transistor structure of claim 14, further comprising:
    a plurality of insulating materials located between the plurality of bit lines, wherein
    the plurality of insulating materials extend in the second direction.

16. A dynamic random-access memory (DRAM) device comprising:
    a vertical-channel cell array transistor structure including a semiconductor substrate, a plurality of channels arranged in an array on the semiconductor substrate, a gate insulating layer on the plurality of channels, a plurality of word lines on the semiconductor substrate, a two-dimensional (2D) material layer directly contacting at least one surface of each of the plurality of word lines,
    each of the plurality of channels extending perpendicularly from the semiconductor substrate, and
    the plurality of word lines extending in a first direction; and a plurality of capacitors on the vertical-channel cell array transistor structure.

17. The DRAM device of claim 16,
wherein the 2D material layer is on at least one of a bottom surface of the plurality of word lines and a top surface of the plurality of word lines.

18. The DRAM device of claim 17,
wherein the 2D material layer further extends to a side surface of each of the plurality of word lines.

19. The DRAM device of claim 16, wherein
the semiconductor substrate includes a plurality of source regions,
the plurality of channels include a plurality of drain regions such that each one of the plurality of channels includes one of the plurality of drain regions,
the plurality of source regions and the plurality of drain regions respectively provided on a lower portion and an upper portion of each corresponding channel among the plurality of channels.

20. The DRAM device of claim 19,
wherein the vertical-channel cell array transistor structure further comprises a plurality of bit lines connecting the plurality of source regions in a second direction that intersects the first direction.

21. The DRAM device of claim 19,
wherein each of the plurality of capacitors is electrically connected to a corresponding one of the plurality of drain regions.

22. An electronic device comprising:
the DRAM device of claim 16.

23. A vertical-channel cell array transistor structure comprising:
a semiconductor substrate including a source region;
a channel structure on the source region, the channel structure including a channel extending vertical to an upper surface of the semiconductor substrate and a drain region over the channel;
a word line on the semiconductor substrate, the word line extending in a first direction;
a gate insulating layer between the word line and the channel structure, the gate insulating layer surrounding the channel structure; and
a two-dimensional (2D) material layer directly contacting the word line.

24. The vertical-channel cell array transistor of claim 23, wherein the 2D material layer comprises at least one of graphene, transition metal dichalcogenide (TMD), GaSe, $GaTe_2$, SnSe, $Bi_2Se_3$, $Bi_2O_2Se$, hexagonal boron nitride (h-BN), amorphous boron nitride (a-BN), silicene, stanene, tellurene, borophene, and antimonene.

25. The vertical-channel cell array transistor of claim 23, wherein the 2D material layer directly contacts a bottom surface of the word line.

26. The vertical-channel cell array transistor of claim 23, wherein the 2D material layer directly contacts a top surface of the word line.

27. The vertical-channel cell array transistor of claim 23, wherein the 2D material layer extends between the word line and the gate insulating layer.

* * * * *